US012808745B2

(12) United States Patent
Ye et al.

(10) Patent No.: US 12,808,745 B2
(45) Date of Patent: Nov. 24, 2026

(54) SELF-ADAPTIVE COOLING SYSTEM FOR MOVING COIL OF HIGH-THRUST ELECTRODYNAMIC VIBRATION TABLE AND CONTROL METHOD THEREOF

(71) Applicants: SUZHOU DONGLING VIBRATION TEST INSTRUMENT CO., LTD., Jiangsu (CN); China University of Mining and Technology, Jiangsu (CN)

(72) Inventors: Tengbo Ye, Jiangsu (CN); Yu Tang, Jiangsu (CN); Xiaohong Fu, Jiangsu (CN); Gang Shen, Jiangsu (CN); Guang Meng, Jiangsu (CN); Hongguang Li, Jiangsu (CN); Zhencai Zhu, Jiangsu (CN); Hao Lu, Jiangsu (CN); Pengpeng Chen, Jiangsu (CN); Yuxing Peng, Jiangsu (CN); Xiangdong Chang, Jiangsu (CN)

(73) Assignees: SUZHOU DONGLING VIBRATION TEST INSTRUMENT CO., LTD., Jiangsu (CN); China University of Mining and Technology, Jiangsu (CN)

( * ) Notice: Subject to any disclaimer, the term of this patent is extended or adjusted under 35 U.S.C. 154(b) by 357 days.

(21) Appl. No.: 18/726,126

(22) PCT Filed: Dec. 1, 2023

(86) PCT No.: PCT/CN2023/135858
§ 371 (c)(1),
(2) Date: Jul. 2, 2024

(87) PCT Pub. No.: WO2025/000888
PCT Pub. Date: Jan. 2, 2025

(65) Prior Publication Data

US 2026/0251527 A1 Aug. 27, 2026

(30) Foreign Application Priority Data

Jun. 28, 2023 (CN) ......................... 202310778690.2

(51) Int. Cl.
*F25D 17/02* (2006.01)
*F25D 29/00* (2006.01)
(Continued)

(52) U.S. Cl.
CPC ............ *G01M 7/022* (2013.01); *H01F 7/202* (2013.01); *H01F 27/16* (2013.01); *H05K 7/20272* (2013.01); *H05K 7/20281* (2013.01)

(58) Field of Classification Search
CPC ........ F25D 17/02; G01M 7/022; H01F 7/202; H01F 27/16; H05K 7/20272; H05K 7/20281
See application file for complete search history.

(56) References Cited

FOREIGN PATENT DOCUMENTS

| | | | | |
|---|---|---|---|---|
| CA | 3092324 A1 * | 9/2019 | .............. | F25B 41/24 |
| CN | 1318850 | 10/2001 | | |

(Continued)

OTHER PUBLICATIONS

"International Search Report (Form PCT/ISA/210) of PCT/CN2023/135858", mailed on Mar. 13, 2024, pp. 1-5.

*Primary Examiner* — Stephen D Meier
*Assistant Examiner* — Quang X Nguyen
(74) *Attorney, Agent, or Firm* — JC ONE WORLD

(57) ABSTRACT

A method for controlling a self-adaptive cooling system for a moving coil of a high-thrust electrodynamic vibration table includes following steps. Detecting, through temperature sensors, water temperatures at first, second and third water inlets and/or water outlets of a driving coil. Detecting an actual current of the driving coil through a sensor. Presetting a minimum threshold of a current intensity and a maximum (Continued)

threshold of the current intensity, comparing the actual current with the minimum and maximum thresholds, and adjusting a rotating velocity of a driving motor. Determining whether the rotating velocity reaches a rated rotating velocity, adjusting the rotating velocity again when it does not reach the rated rotating velocity. Controlling the three-position four-way reversing valve to vary directions of the first, second and third water inlets and/or water outlets of the cooling system to complete a reversal of a flow direction of cooling water within the driving coil.

6 Claims, 3 Drawing Sheets

(51) Int. Cl.

| | |
|---|---|
| ***G01D 21/02*** | (2006.01) |
| ***G01M 7/02*** | (2006.01) |
| ***H01F 7/20*** | (2006.01) |
| ***H01F 27/16*** | (2006.01) |
| ***H05K 7/20*** | (2006.01) |

(56) References Cited

FOREIGN PATENT DOCUMENTS

| | | | | |
|---|---|---|---|---|
| CN | 2821555 | | | 9/2006 |
| CN | 201126396 | | | 10/2008 |
| CN | 201193974 | | | 2/2009 |
| CN | 206890856 | U | * | 1/2018 |
| CN | 115270502 | | | 11/2022 |
| CN | 219243957 | U | * | 6/2023 |
| CN | 116928948 | | | 10/2023 |
| JP | S57143881 | | | 9/1982 |
| JP | 2000092815 | | | 3/2000 |
| JP | 2000208320 | | | 7/2000 |

* cited by examiner

SELF-ADAPTIVE COOLING SYSTEM FOR MOVING COIL OF HIGH-THRUST ELECTRODYNAMIC VIBRATION TABLE AND CONTROL METHOD THEREOF

TECHNICAL FIELD

The present disclosure relates to the technical field of vibration table, and more specifically relates to a self-adaptive cooling system for a moving coil of a high-trust electrodynamic vibration table and a control method thereof.

DESCRIPTION OF RELATED ART

The electrodynamic vibration table is mainly used to simulate the vibration environment in which the tested piece is located and test the reliability and durability of the tested piece in the vibration environment. The electrodynamic vibration table is widely used in the fields such as aerospace, shipping vehicles, rail transportation, engineering machinery. For the electrodynamic vibration table, since the parts such as the moving coil windings, the excitation windings and the short-circuit rings have relatively large density values for the operating current, the heat generated by these parts is commonly extremely large during operation. If these coils are not cooled to dissipate the heat, the temperature of these coils will gradually increase in a short time period until these coils are burned out by the high temperature, which causes the equipment shutdown. Therefore, the electrodynamic vibration table generally have the ventilation system and the water cooling system, the ventilation system is mainly utilized to the low-thrust electrodynamic vibration tables, and the water cooling system is mainly utilized to the high-thrust electrodynamic vibration table.

For the high-thrust electrodynamic vibration table whose working coils are cooled by the water (distilled water), the coils are all the hollow coils and are used for water cooling. At present, the driving coil is generally cooled by a method of providing a constant volume of cooling water, when the high-thrust electrodynamic vibration table is cooled. As the power of the vibration table increases, there are the following problems: ① The temperature of the cooling water is low at the water inlet of the driving coil, and the cooling effect is well, but when the water circulates to the water outlet, the water temperature rises and the cooling effect becomes worse, which results in an uneven cooling effect of the driving coil and a large temperature difference between the water temperatures at the inlet and the outlet of the driving coil. ② For the different loads, the amount of heats generated by the driving coil with different loads are also different when the electrodynamic vibration table is operating. If the same relatively large volume of flow is utilized for cooling, it will cause a waste of energy consumption.

In view of this, it is necessary to improve the operating means of the high-thrust electrodynamic vibration table in the prior art to solve the above problems.

SUMMARY

The objectives of the present disclosure are to disclose a self-adaptive cooling system for a moving coil of a high-thrust electrodynamic vibration table and a control method thereof to solve the above technical problems. The water inlet-outlets of the driving coil are exchanged through adding a three-position four-way reversing valve to reduce the temperature difference of the temperatures at the inlet-outlets of the driving coil, and the flow rate of the cooling system is controlled through self-adaptively adjusting the rotating velocity of the driving motor, thereby improving the utilization efficiency of the cooling system.

In order to achieve the above objectives, a self-adaptive cooing system for a moving coil of a high-thrust electrodynamic vibration table is provided in the present disclosure. The cooling system comprises a water tank, a filter, a hydraulic pump, a driving coil and a heat exchanger sequentially connected in series through pipelines to form a circulation loop. The hydraulic pump is equipped with a driving motor, the driving coil has a structure in a spiral tubular shape, and one end of the driving coil is formed with a first water inlet and/or water outlet, and another end of the driving coil is formed with a second water inlet and/or water outlet, and an intermediate of the driving coil is provided with a third water inlet and/or water outlet. The cooling system further includes a three-position four-way reversing valve, a first temperature sensor, a second temperature sensor and a third temperature sensor, a current sensor and a controller.

The three-position four-way reversing valve is arranged on a pipeline connecting the hydraulic pump and the driving coil, and has four ports of P, A, B, and T. The port P is connected to a water outlet of the hydraulic pump through a pipeline, the port A is connected to the first water inlet and/or water outlet and the second water inlet and/or water outlet of the driving coil through a pipeline, the port B is connected to the third water inlet and/or water outlet through a pipeline, and the port T is connected to a water outlet of the heat exchanger through a pipeline.

The first temperature sensor, the second temperature sensor and the third temperature sensor are arranged at the first water inlet and/or water outlet, the second water inlet and/or water outlet, and the third water inlet and/or water outlet, respectively.

The current sensor is arranged on the driving coil, and configured to monitor a driving current of the driving coil.

The controller is configured to receive data collected by the temperature sensors and the current sensor, and control the three-position four-way reversing valve and the driving motor to vary a rotating velocity of the driving motor and a flow direction of a water flow within the driving coil.

A method for controlling a self-adaptive cooling system for a moving coil of a high-thrust electrodynamic vibration table is further disclosed in the present disclosure. The method includes following steps.

S1, in an operation state of the vibration table, a water temperature $T_{in1}$ at the first water inlet and/or water outlet, a water temperature $T_{in2}$ at the second water inlet and/or water outlet, and a water temperature $T_{out}$ at the third water inlet and/or water outlet of the driving coil are detected through the first temperature sensor, the second temperature sensor and the third temperature sensor in real time.

S2, an actual current $I_e$ of the driving coil is detected through the current sensor, a minimum threshold $\lambda_{low}*I_n$ of a current intensity and a maximum threshold $\lambda_{high}*I_n$ of the current intensity are preset, the actual current $I_e$ of the driving coil is compared with the minimum threshold $\lambda_{low}*I_n$ and the maximum threshold $\lambda_{high}*I_n$, and the rotating velocity of the driving motor is adjusted for a first time.

S3, whether the rotating velocity of the driving motor reaches a rated rotating velocity n is determined, when the rotating velocity of the driving motor does not reach the rated rotating velocity n, the rotating velocity of the driving motor is adjusted again.

S4, when the rotating velocity of the driving motor reaches the rated rotating velocity n, and the water temperature $T_{out}$ at the third water inlet and/or water outlet is detected to exceed an average temperature of the water temperature $T_{in1}$ at the first water inlet and/or water outlet of the driving coil and the water temperature $T_{in2}$ at the second water inlet and/or water outlet of the driving coil by $\Delta T_2$ or more, the three-position four-way reversing valve is controlled to vary directions of the water inlets and/or water outlets of the cooling system to complete a reversal of a flow direction of cooling water within the driving coil.

As an improvement of the present disclosure, in the step S1, the cooling system is determined whether to be activated through comparing $T_{avg}$ with $T_{lim}$.

When $T_{avg} \leq T_{lim}$, the cooling system is inactivated.

When $T_{avg} > T_{lim}$, the cooling system is activated.

$T_{lim}$ denotes a temperature threshold set according to actual equipment, and $T_{avg}$ denotes the average temperature $$T_{avg} = \frac{T_{in1} + T_{in2} + T_{out}}{3}$$

at the water inlets and/or water outlets of the driving coil.

As a further improvement of the present disclosure, in the step S2, adjusting the rotating velocity of the driving motor specifically includes as follows.

When $I_e \leq \lambda_{low}\% \cdot I_n$, the rotating velocity of the driving motor is adjusted to $\lambda_{low}$*n of the rated rotating velocity.

When $\lambda_{low}\% \cdot I_n < I_e \geq \lambda_{high}\% \cdot I_n$, the rotating velocity of the driving motor is adjusted to $\lambda_{high}$*n of the rated rotating velocity.

When $I_e > \lambda_{high}\% \cdot I_n$, the rotating velocity of the driving motor is adjusted to the rated rotating velocity n.

As a further improvement of the present disclosure, in the step S3, adjusting the rotating velocity of the driving motor for a second time includes as follows.

S31, the water temperature $T_{in1}$ at the first water inlet and/or water outlet of the driving coil, the water temperature $T_{in2}$ at the second water inlet and/or water outlet of the driving coil, and the water temperature $T_{out}$ at the third water inlet and/or water outlet of the driving coil are re-detected.

S32, after a time period of $\Delta t$ is passed, whether the average temperature $T_{avg}$ of the water temperatures at the water inlets and/or water outlets of the driving coil is increased by $\Delta T_1$ is determined and detected.

S33, when the average temperature Tavg is increased by $\Delta T_1$, the rotating velocity of the driving coil is increased by δ% n.

S34, whether the rotating velocity of the driving motor reaches the rated rotating velocity n is continuously compared and determined, when the rotating velocity of the driving motor reaches or exceeds the rated rotating velocity n, the rotating velocity of the driving motor is adjusted to the rated rotating velocity n.

When the rotating velocity of the driving motor does not reach the rated rotating velocity n, the steps S31, S32, and S33 are repeated in sequence until the rotating velocity of the driving motor reaches or exceeds the rated rotating velocity n.

$\Delta t$ denotes a time quantity set according to the actual equipment, $\Delta T_1$ denotes a temperature quantity set according to the actual equipment, and δ denotes an increment on the rotating velocity of the motor set according to the actual equipment.

As a further improvement of the present disclosure, the method further includes step S5. In the step S5, the water temperature $T_{in1}$ at the first water inlet and/or water outlet of the driving coil, the water temperature $T_{in2}$ at the second water inlet and/or water outlet of the driving coil, and the water temperature $T_{out}$ at the third water inlet and/or water outlet of the driving coil are continuously detected in real time. When $(T_{in1}+T_{in2})/2-T_{out}>\Delta T_2$, the three-position four-way reversing valve is controlled to vary a direction again to vary the directions of the water inlets and/or water outlets of the cooling system, and the steps S4 and S5 are repeated in sequence.

As a further improvement of the present disclosure, $T_{lim}$ ranges from 25 °C to 40 °C.

As a further improvement of the present disclosure, $\lambda_{low}$ ranges from 20 to 40, and $\lambda_{high}$ ranges from 60 to 80.

As a further improvement of the present disclosure, $\Delta t$ ranges from 10 s to 20 s, and $\Delta T_1$ ranges from 5 °C to 10 °C, $\Delta T_2$ ranges from 10 °C to 20 °C, and δ ranges from 10 to 20.

Compared with the prior art, the beneficial effects of the present disclosure lie below.

The self-adaptive cooling system for the moving coil of the high-thrust electrodynamic vibration table implements the adjustment on the directions of the water inlets and/or water outlets of the driving coil through a combination of the driving coil having the first water inlet and/or water outlet, the second water inlet and/or water outlet and the third water inlet and/or water outlet, the three-position four-way reversing valve, the temperature sensors, the current sensor and the controller, and detects the operating current of the driving coil through the current sensor, and implements the adjustment on the rotating velocity of the driving motor by the controller, which enables the system to be more in line with the actual usage of the equipment and improves the efficiency of the resource utilization. The method for controlling the cooling system can adaptively adjust the rotating velocity of the driving motor according to the variation of the temperature of the driving coil in operating of the electrodynamic vibration table, thereby controlling the volume of flow of the cooling system and improving the utilization efficiency of the cooling system. In order to avoid the problem that the temperature difference between the water temperatures at the water inlets and the water outlets is excessive large when the cooling system of the electrodynamic vibration table is operating, the three-position four-way reversing valve is added to exchange the directions of the water inlets and the water outlets to reduce the temperature difference between the temperatures at the water inlets and the water outlets of the driving coil. The method provided in the present disclosure is ingenious, easy to operate, easy to maintain, has strong adaptability and high practicality.

Figure 1:
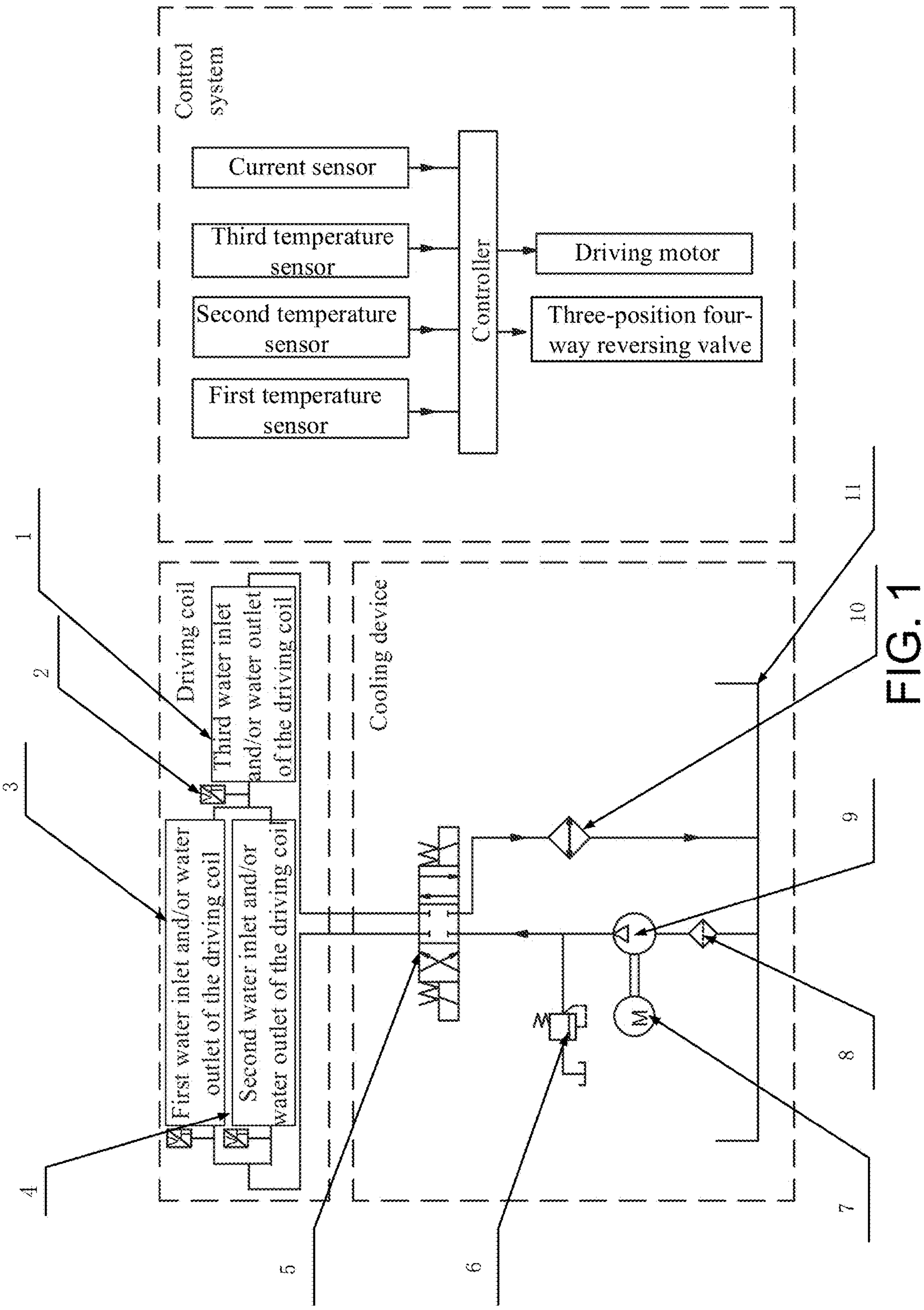
FIG. 1 illustrates a schematic diagram of a self-adaptive cooling system for a moving coil of a high-thrust electrodynamic vibration table in the present disclosure.

In the drawings, 1. Third water inlet and/or water outlet, 2. Temperature sensor, 3. Second water inlet and/or water outlet, 4. First water inlet and/or water outlet, 5. Three-position four-way reversing valve, 6. Relief valve, 7. Driving motor, 8. Filter, 9. Hydraulic pump, 10. Heat exchanger, 11. Water tank.

DESCRIPTION OF THE EMBODIMENTS

The present disclosure will be described in detail below with reference to the various embodiments illustrated in the accompanying drawings. However, it should be noted that these embodiments do not limit the present disclosure. The equivalent transformations or substitutions on the functions, methods or structures made by those of ordinary skill in the art according to these embodiments are all within the scope of the present disclosure.

Figure 2:
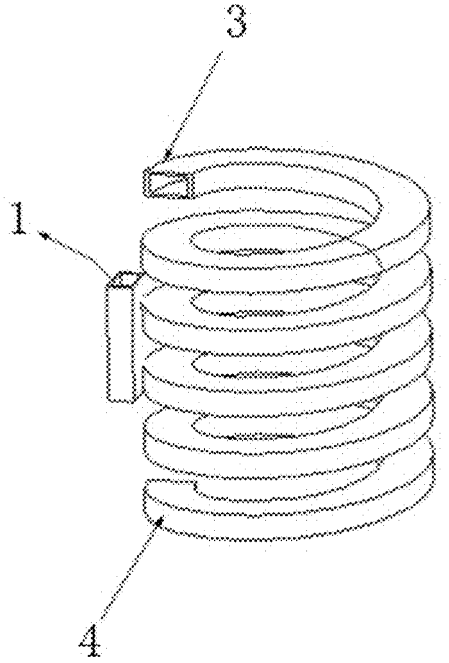
FIG. 2 illustrates a schematic diagram of a driving coil in the self-adaptive cooling system for the moving coil of the high-thrust electrodynamic vibration table in the present disclosure.
Figure 3:
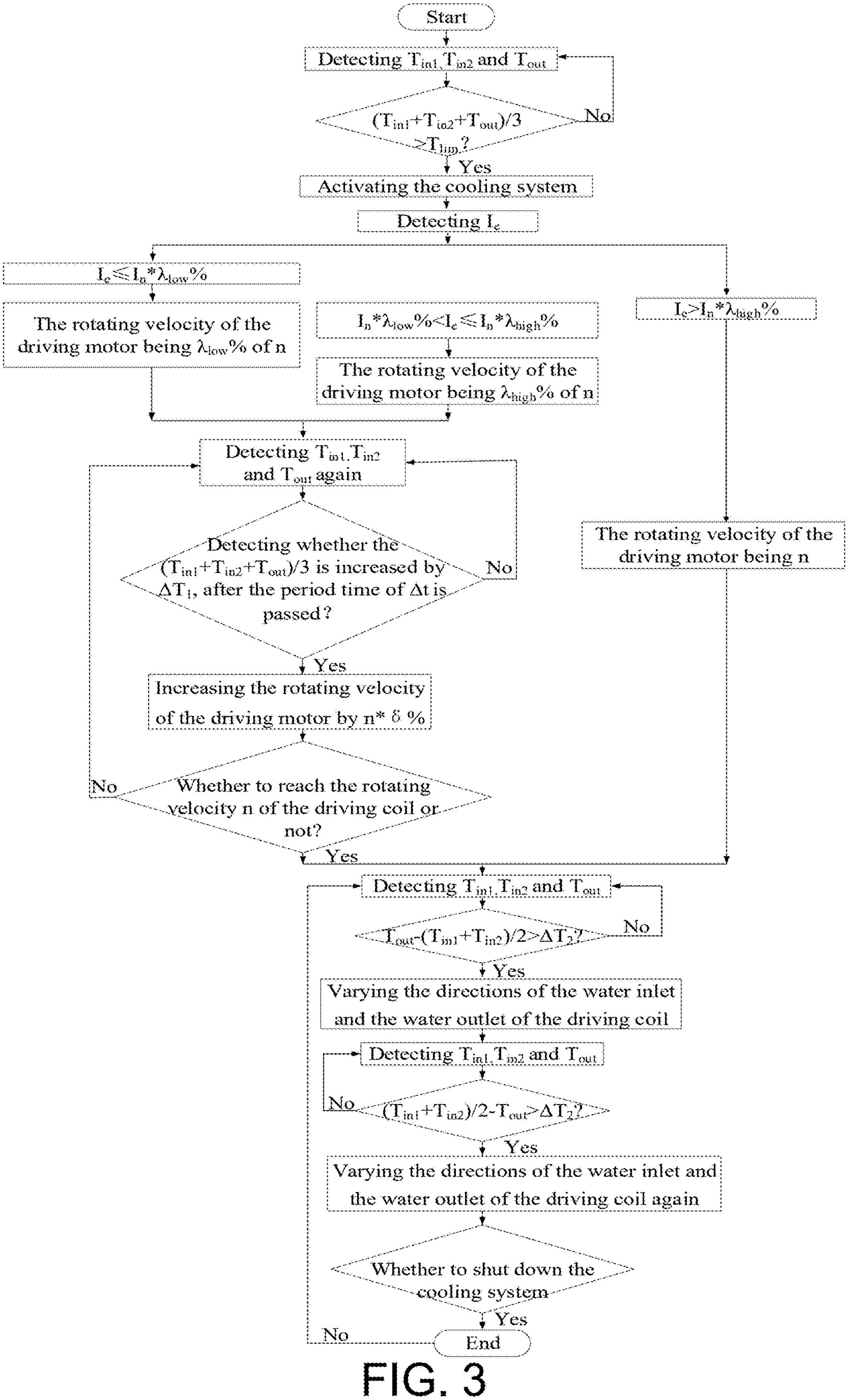
FIG. 3 illustrates a schematic flow chart of the self-adaptive cooling system for the moving coil of the high-thrust electrodynamic vibration table and a control method thereof in the present disclosure.

One specific embodiment of a self-adaptive cooling system for a moving coil of a high-thrust electrodynamic vibration platform provided in the present disclosure is illustrated in FIG. 1 to FIG. 3.

Provided is a self-adaptive cooling system for a moving coil of a high-thrust electrodynamic vibration table. The cooling system includes a water tank 11, a filter 8, a hydraulic pump 9, a driving coil and a heat exchanger 10 that are sequentially connected in series through pipelines to form a circulation loop. The hydraulic pump 9 is a constant displacement pump, and equipped with a driving motor 7, and a relief valve 6 is connected to a water outlet branch of the hydraulic pump 9. The driving coil has a structure in a spiral tubular shape, and one end of the driving coil is formed with a first water inlet and/or water outlet 4, the other end of the driving coil is formed with a second water inlet and/or water outlet 3, and an intermediate of the driving coil is provided with a third water inlet and/or water outlet 1. The cooling system further includes a three-position four-way reversing valve 5, a first temperature sensor 2, a second temperature sensor 2, a third temperature sensor 2, a current sensor, a controller. The three-position four-way reversing valve 5 is arranged on a pipeline connecting the hydraulic pump 9 and the driving coil, and has four ports of P, A, B and T. The port P is connected to a water outlet of the hydraulic pump 9 through a pipeline, the port A is connected to the first water inlet and/or water outlet 4 and the second water inlet and/or water outlet 3 of the driving coil through pipelines, the port B is connected to the third water inlet and/or water outlet 1 through a pipeline, and the port T is connected to a water inlet of the heat exchanger 10 through a pipeline. The first temperature sensor 2, the second temperature sensor 2, and the third temperature sensor 2 are respectively arranged at the first water inlet and/or water outlet 4, the second water inlet and/or water outlet 3, and the third water inlet and/or water outlet 1. The current sensor is arranged on the driving coil, and is configured to monitor a driving current of the driving coil. The controller is configured to receive the data collected by the temperature sensors 2 and the current sensor, and control the three-position four-way reversing valve 5 and the driving motor 7 to vary the rotating velocity of the driving motor 7 and the flow direction of the water flow within the driving coil.

The operation principles are as follows. The cooling water is provided for the driving coil through a method of the hydraulic pump 9 driven by the driving motor 7, which can vary the flow volume of the cooling system through varying the rotating velocity of the servo motor. The cooling water is entered the driving coil through the three-position four-way reversing valve 5, and the cooling water inlet and the cooling water outlet of the driving coil can be varied through the reversal of the three-position four-way reversing valve 5, and finally, the cooling water is returned to the water tank 11 through the heat exchanger 10 to implement the cooling water path with the optimum cooling effect.

The present disclosure further discloses a method for controlling the self-adaptive cooling system for the moving coil of the high-thrust electrodynamic vibration table. The method includes following steps.

In S1, in an operation state of the vibration table, a water temperature $T_{in1}$ at the first water inlet and/or water outlet 4, a water temperature $T_{in2}$ at the second water inlet and/or water outlet 3, and a water temperature $T_{out}$ at the third water inlet and/or water outlet 1 of the driving coil are detected through the first temperature sensor 2, the second temperature sensor 2 and the third temperature sensor 2 in real time. In the step S1, the cooling system is determined whether to be activated through comparing $T_{avg}$ with $T_{lim}$, when $T_{avg} \leq T_{lim}$, the cooling system is inactivated, when $T_{avg} > T_{lim}$, the cooling system is activated. $T_{lim}$ denotes a temperature threshold which is set according to an actual equipment, $T_{lim}$ ranges from 25 °C to 40 °C, and $T_{avg}$ denotes an average temperature $$T_{avg} = \frac{T_{in1} + T_{in2} + T_{out}}{3}$$

of the temperatures at the water inlets and/or water outlets of the driving coil.

In S2, an actual current $I_e$ of the driving coil is detected by the current sensor. A minimum threshold $\lambda_{low} * I_n$ of the current intensity and a maximum threshold $\lambda_{high} * I_n$ of the current intensity are preset, $\lambda_{low}$ ranges from 20 to 40, $\lambda_{high}$ ranges from 60 to 80. The actual current $I_e$ of the driving coil is compared with the minimum threshold $\lambda_{low} * I_n$ and the maximum threshold $\lambda_{high} * I_n$, the rotating velocity of the driving motor 7 is adjusted for a first time, and the adjustment means is specifically as follows.

When $I_e \leq \lambda_{low}\% \cdot I_n$, the rotating velocity of the driving motor 7 is adjusted to $\lambda_{low}$*n of a rated rotating velocity.

When $\lambda_{low}\% \cdot I_n < I_e \leq \lambda_{high}\% \cdot I_n$, the rotating velocity of the driving motor 7 is adjusted to $\lambda_{high}$*n of the rated rotating velocity.

When $I_e > \lambda_{high}\% \cdot I_n$, the rotating velocity of the driving motor 7 is adjusted to the rated rotation velocity n.

In S3, whether the rotating velocity of the driving motor 7 reaches the rated rotating velocity n is determined, when the rotating velocity of the driving motor 7 does not reach the rated rotating velocity n, the rotating velocity of the driving motor 7 is adjusted again, and the means for adjusting the rotating velocity of the driving motor 7 again is as follows. In S31, the water temperature $T_{in1}$ at the first water inlet and/or water outlet 4 of the driving coil, the water temperature $T_{in2}$ at the second water inlet and/or water outlet 3 of the driving coil, and the water temperature $T_{out}$ at the third water inlet and/or water outlet 1 of the driving coil are re-detected.

In S32, whether the average temperature $T_{avg}$ of the water temperatures at the water inlets and/or water outlets of the driving coil is increased by $\Delta T_1$ is detected and determined, after a time period of $\Delta t$ is passed. In S33, when the average temperature $T_{avg}$ is increased by $\Delta T_1$, the rotating velocity of the driving motor 7 is increased by δ% n. In S34, whether the rotating velocity of the rotating motor 7 reaches the rated velocity n is continuously compared and determined, when the rotating velocity of the driving motor 7 reaches or exceeds the rated velocity n, the rotating velocity of the driving motor 7 is adjusted to the rated velocity n; when the rotating velocity of the driving motor 7 still does not reach the rated rotating velocity n, the steps S31, S32 and S33 are repeated in sequence, until the rotating velocity of the driving motor 7 reaches or exceeds the rated velocity n. Δt denotes a time quantity which is set according to the actual equipment, and $\Delta T_1$ denotes a temperature quantity which is set according to the actual equipment. Δt ranges from 10 s to 20 s, and $\Delta T_1$ ranges from 5 °C to 10 °C δ denotes an increment on the rotating velocity of the motor which is set according to the actual equipment, and δ ranges from 10 to 20.

In S4, when the rotating velocity of the driving motor 7 reaches the rated rotating velocity n, and the water temperature $T_{out}$ at the third water inlet and/or water outlet 1 is detected to exceed an average temperature of the water temperature $T_{in1}$ at the first water inlet and/or water outlet 4 of the driving coil and the water temperature $T_{in2}$ at the second water inlet and/or water outlet 3 of the driving coil by $\Delta T_2$ or more, and $\Delta T_2$ ranges from 10 °C and 20 °C, then the three-position four-way reversing valve 5 is controlled to vary the directions of the water inlets and/or water outlets of the cooling system to complete the reversal of the flow direction of the cooling water within the driving coil.

The method further includes step S5. In the step S5, the water temperature $T_{in1}$ at the first water inlet and/or water outlet 4 of the driving coil, the water temperature $T_{in2}$ at the second water inlet and/or water outlet 3 of the driving coil, and the water temperature $T_{out}$ at the third water inlet and/or water outlet 1 of the driving coil are continuously detected in real time, when $(T_{in1}+T_{in2})/2-T_{out}>\Delta T_2$, the three-position four-way reversing valve 5 is controlled to vary a direction again to vary the directions of the water inlets and/or water outlets of the cooling system, and the steps S4 and S5 are repeated in sequence.

In addition, it should be understood that although the description is described in terms of the embodiments, not each embodiment merely contains an independent technical solution. This description means of the description is merely for the sake of clarity, and those skilled in the art should take the description as a whole, and the technical solutions in each embodiment can also be appropriately combined to form other embodiments that can be understood by those skilled in the art.

What is claimed is:

1. A method for controlling a self-adaptive cooling system for a moving coil of a high-thrust electrodynamic vibration table, wherein the cooling system comprises a water tank, a filter, a hydraulic pump, a driving coil and a heat exchanger sequentially connected in series through pipelines to form a circulation loop, the hydraulic pump is equipped with a driving motor, the driving coil has a structure in a spiral tubular shape, and one end of the driving coil is formed with a first water inlet and/or water outlet, and another end of the driving coil is formed with a second water inlet and/or water outlet, and an intermediate of the driving coil is provided with a third water inlet and/or water outlet, the cooling system further includes:

a three-position four-way reversing valve, arranged on a pipeline connecting the hydraulic pump and the driving coil, having four ports of P, A, B and T, wherein the port P is connected to a water outlet of the hydraulic pump through a pipeline, the port A is connected to the first water inlet and/or water outlet and the second water inlet and/or water outlet of the driving coil through a pipeline, the port B is connected to the third water inlet and/or water outlet through a pipeline, and the port T is connected to a water inlet of the heat exchanger through a pipeline;

a first temperature sensor, a second temperature sensor and a third temperature sensor, arranged at the first water inlet and/or water outlet, the second water inlet and/or water outlet, and the third water inlet and/or water outlet, respectively;

a current sensor, arranged on the driving coil, and configured to monitor a driving current of the driving coil; and a controller, configured to receive data collected by the first, second and third temperature sensors and the current sensor, and control the three-position four-way reversing valve and the driving motor to vary a rotating velocity of the driving motor and a flow direction of a water flow within the driving coil, the method comprising following steps:

step S1, detecting, through the first temperature sensor, the second temperature sensor, the third temperature sensor, a water temperature $T_{in1}$ at the first water inlet and/or water outlet of the driving coil, a water temperature $T_{in2}$ at the second water inlet and/or water outlet of the driving coil, and a water temperature $T_{out}$ at the third water inlet and/or water outlet of the driving coil in real time, in an operation state of the vibration table;

step S2, detecting, through the current sensor, an actual current $I_e$ of the driving coil; presetting a minimum threshold $\lambda_{low}*I_n$ of a current intensity and a maximum threshold $\lambda_{high}*I_n$ of the current intensity, comparing the actual current $I_e$ of the driving coil with the minimum threshold $\lambda_{low}*I_n$ and the maximum threshold $\lambda_{high}*I_n$, and adjusting the rotating velocity of the driving motor for a first time;

step S3, determining whether the rotating velocity of the driving motor reaches a rated rotating velocity n, adjusting, when the rotating velocity of the driving motor does not reach the rated rotating velocity n, the rotating velocity of the driving motor for a second time; and step S4, controlling, when the rotating velocity of the driving motor reaches the rated rotating velocity n, and the water temperature $T_{out}$ at the third water inlet and/or water outlet is detected to exceed an average temperature of the water temperature $T_{in1}$ at the first water inlet and/or water outlet of the driving coil and the water temperature $T_{in2}$ at the second water inlet and/or water outlet of the driving coil by $\Delta T_2$ or more, the three-position four-way reversing valve to vary directions of the first, second and third water inlets and/or water outlets of the cooling system to complete a reversal of a flow direction of cooling water within the driving coil, wherein in the step S1, the cooling system is determined whether to be activated through comparing $T_{avg}$ with $T_{lim}$, when $T_{avg}\leq T_{lim}$, the cooling system is inactivated;

when $T_{avg}>T_{lim}$, the cooling system is activated;

wherein $T_{lim}$ denotes a temperature threshold set according to actual equipment, and $T_{avg}$ denotes an average temperature $$T_{avg} = \frac{T_{in1} + T_{in2} + T_{out}}{3}$$

at the first, second and third water inlets and/or water outlets of the driving coil, wherein in the step S3, adjusting the rotating velocity of the driving motor for a second time includes:

S31, re-detecting the water temperature $T_{in1}$ at the first water inlet and/or water outlet of the driving coil, the water temperature $T_{in2}$ at the second water inlet and/or water outlet of the driving coil, and the water temperature $T_{out}$ at the third water inlet and/or water outlet of the driving coil;

S32, determining and detecting, after a time period of Δt is passed, whether the average temperature $T_{avg}$ of the water temperatures at the first, second and third water inlets and/or water outlets of the driving coil is increased by $\Delta T_1$;

S33, increasing, when the average temperature Tavg is increased by $\Delta T_1$, the rotating velocity of the driving coil by δ% n;

S34, continuously comparing and determining whether the rotating velocity of the driving motor reaches the rated rotating velocity n, and adjusting, when the rotating velocity of the driving motor reaches or exceeds the rated rotating velocity n, the rotating velocity of the driving motor to the rated rotating velocity n; and repeating, when the rotating velocity of the driving motor does not reach the rated rotating velocity n, the steps S31, S32, and S33 in sequence until the rotating velocity of the driving motor reaches or exceeds the rated rotating velocity n;

wherein Δt denotes a time quantity set according to the actual equipment, $\Delta T_1$ denotes a temperature quantity set according to the actual equipment, and δ denotes an increment on the rotating velocity of the motor set according to the actual equipment.

2. The method for controlling the self-adaptive cooling system for the moving coil of the high-thrust electrodynamic vibration table according to claim 1, wherein in the step S2, adjusting the rotating velocity of the driving motor includes:

adjusting, when $I_e \leq \lambda_{low}\% \cdot I_n$, the rotating velocity of the driving motor to $\lambda_{low}$*n of the rated rotating velocity;

adjusting, when $\lambda_{low}\% \cdot I_n < I_e \leq \lambda_{high}\% \cdot I_n$, the rotating velocity of the driving motor to $\lambda_{high}$*n of the rated rotating velocity; and adjusting, when $I_e > \lambda_{high}\% \cdot I_n$, the rotating velocity of the driving motor to the rated rotating velocity n.

3. The method for controlling the self-adaptive cooling system for the moving coil of the high-thrust electrodynamic vibration table according to claim 1, wherein the method further comprises step S5:

continuously detecting the water temperature $T_{in1}$ at the first water inlet and/or water outlet of the driving coil, the water temperature $T_{in2}$ at the second water inlet and/or water outlet of the driving coil, and the water temperature $T_{out}$ at the third water inlet and/or water outlet of the driving coil in real time; and controlling, when $(T_{in1}+T_{in2})/2-T_{out}>\Delta T_2$, the three-position four-way reversing valve to reverse again to vary the directions of the first, second and third water inlets and/or water outlets of the cooling system, and repeating the steps S4 and S5 in sequence.

4. The method for controlling the self-adaptive cooling system for the moving coil of the high-thrust electrodynamic vibration table according to claim 1, wherein $T_{lim}$ ranges from 25 °C to 40 °C.

5. The method for controlling the self-adaptive cooling system for the moving coil of the high-thrust electrodynamic vibration table according to claim 1, wherein $\lambda_{low}$ ranges from 20 to 40, and $\lambda_{high}$ ranges from 60 to 80.

6. The method for controlling the self-adaptive cooling system for the moving coil of the high-thrust electrodynamic vibration table according to claim 1, wherein Δt ranges from 10 seconds to 20 seconds, and $\Delta T_1$ ranges from 5 °C to 10 °C, $\Delta T_2$ ranges from 10 °C to 20 °C, and δ ranges from 10 to 20.

* * * * *